(12) United States Patent
Snider

(10) Patent No.: US 7,530,032 B2
(45) Date of Patent: May 5, 2009

(54) NANOWIRE CROSSBAR IMPLEMENTATIONS OF LOGIC GATES USING CONFIGURABLE, TUNNELING RESISTOR JUNCTIONS

(75) Inventor: Gregory S. Snider, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 400 days.

(21) Appl. No.: 11/262,354

(22) Filed: Oct. 28, 2005

(65) Prior Publication Data

US 2007/0101308 A1    May 3, 2007

(51) Int. Cl.
    *G06F 17/50*    (2006.01)
(52) U.S. Cl. .............................. 716/1; 716/12; 977/762; 977/932; 977/940
(58) Field of Classification Search ............. 716/12–14, 716/1; 977/762, 932, 935, 936, 940
    See application file for complete search history.

(56) References Cited

U.S. PATENT DOCUMENTS

| | | | |
|---|---|---|---|
| 2004/0093575 A1* | 5/2004 | Heath et al. | 716/8 |
| 2006/0079455 A1* | 4/2006 | Gazit et al. | 514/12 |
| 2007/0291524 A1* | 12/2007 | Davis et al. | 365/49 |

* cited by examiner

*Primary Examiner*—Paul Dinh

(57) ABSTRACT

Various embodiments of the present invention are directed to nanowire crossbars that use configurable, tunneling resistor junctions to electronically implement logic gates. In one embodiment of the present invention, a nanowire crossbar comprises two or more layers of approximately parallel nanowires, and a number of configurable, tunneling resistor junctions that each interconnects a nanowire in a first layer of approximately parallel nanowires with a nanowire in a second layer of approximately parallel nanowires.

8 Claims, 14 Drawing Sheets

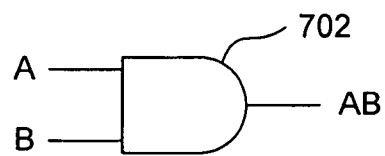
*Figure 7A*
| A | B | AB |
|---|---|---|
| 0 | 0 | 0 |
| 0 | 1 | 0 |
| 1 | 0 | 0 |
| 1 | 1 | 1 |
*Figure 7B*
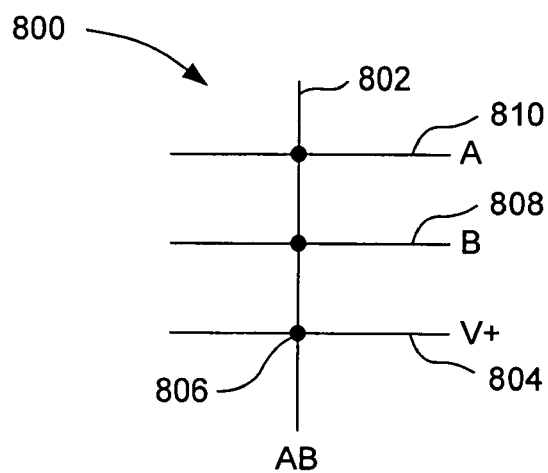
*Figure 8A*

|   | A | B | AB |
|---|---|---|----|
| ① | 0 | 0 | 0 | ← 814
| ② | 0 | 1 | 0 | ← 815
| ③ | 1 | 0 | 0 | ← 816
| ④ | 1 | 1 | 1 | ← 817

812

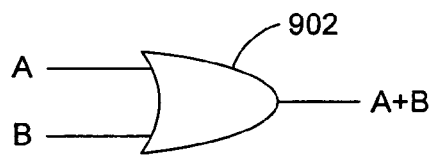
Figure 9A
| A | B | A+B |
|---|---|-----|
| 0 | 0 | 0 |
| 0 | 1 | 1 |
| 1 | 0 | 1 |
| 1 | 1 | 1 |
Figure 9B
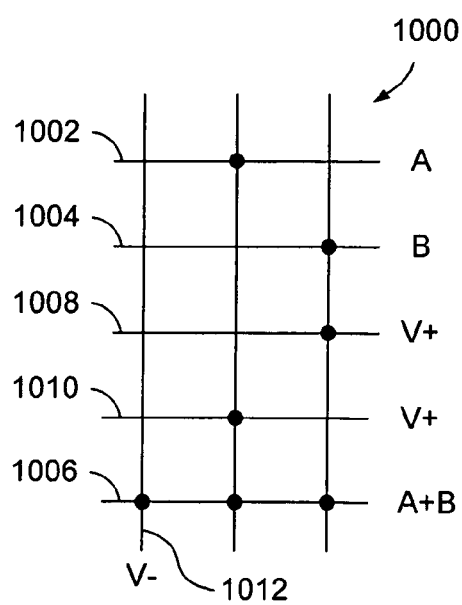
Figure 10A
| Input (volts) | | Output (volts) |
|---|---|---|
| A | B | A+B |
| -2 | -2 | ~-1.1 |
| -2 | 2 | ~0 |
| 2 | -2 | ~0 |
| 2 | 2 | ~0 |
Figure 10B

| A | -A | B | -B | A(-B) | (-A)B | A^B |
|---|----|---|----|-------|-------|-----|
| 0 | 1  | 0 | 1  | 0     | 0     | 0   |
| 0 | 1  | 1 | 0  | 0     | 1     | 1   |
| 1 | 0  | 0 | 1  | 1     | 0     | 1   |
| 1 | 0  | 1 | 0  | 0     | 0     | 0   |

| Input (volts) | | | | Output (volts) |
| --- | --- | --- | --- | --- |
| A | -A | B | -B | A^B |
| -2 | 2 | -2 | 2 | ~-0.9 |
| -2 | 2 | 2 | -2 | ~0 |
| 2 | -2 | -2 | 2 | ~0 |
| 2 | -2 | 2 | -2 | ~-0.9 |

| Input (volts) | | | | Output (volts) | | | |
|---|---|---|---|---|---|---|---|
| A | -A | B | -B | A^B | -(A^B) | A+B | -A+B |
| -2 | 2 | -2 | 2 | ~-0.9 | ~0 | ~-1.1 | ~0 |
| -2 | 2 | 2 | -2 | ~0 | ~-0.9 | ~0 | ~0 |
| 2 | -2 | -2 | 2 | ~0 | ~-0.9 | ~0 | ~-1.1 |
| 2 | -2 | 2 | -2 | ~-0.9 | ~0 | ~0 | ~0 |

1320  1321  1322  1323

*Figure 13B* ns. For example, the electronic properties of certain microscale electrical components, such as diodes or field-effect transistors, that can be used to fabricate microscale logic gates may not be obtainable at nanoscale dimensions. Thus, designers, manufacturers, and users of logic circuits have recognized the need for new nanoscale electronic components that can be used to fabricate electronic-based logic gates.

NANOWIRE CROSSBAR IMPLEMENTATIONS OF LOGIC GATES USING CONFIGURABLE, TUNNELING RESISTOR JUNCTIONS

TECHNICAL FIELD OF THE INVENTION

The present invention is related to nanoscale electronic devices, and, in particular, to logic gates implemented by nanoscale crossbars having configurable, tunneling resistor junctions.

BACKGROUND OF THE INVENTION

During the past fifty years, the electronics and computing industries have been relentlessly propelled forward by ever decreasing sizes of basic electronic components, such as transistors and signal wires, and by correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light, for example, far more technically demanding photolithographic methods may need to be employed. Expensive semiconductor fabrication facilities may need to be rebuilt in order to implement the photolithographic methods. Many new obstacles may be encountered. For example, semiconductor devices are photolithographically fabricated in a series of steps. The masks used in each step are precisely aligned with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor surfaces decrease, resulting in an increasing proportion of defective devices during manufacture, and a correspondingly lower yield of useful product. Ultimately, various quantum effects that arise only at molecular-scale distances may altogether overwhelm current approaches to semiconductor fabrication.

In view of these problems, researchers and developers have expended considerable research effort in fabricating submicroscale and nanoscale electronic devices using alternative technologies. Nanoscale electronic devices generally employ nanoscale signal wires having widths, and nanoscale components having dimensions, of less than 100 nanometers. More densely fabricated nanoscale electronic devices may employ nanoscale signal wires having widths, and nanoscale components having dimensions, of less than 50 nanometers, or, in certain types of devices, less than 10 nanometers.

Although general nanowire technologies have been developed, it is not necessarily straightforward to employ nanowire technologies to miniaturize existing types of circuits and structures. While it may be possible to tediously construct miniaturized, nanowire circuits similar to the much larger, currently available circuits, it is impractical, and often impossible, to manufacture such miniaturized circuits using current technologies. Even were such straightforwardly miniaturized circuits able to be feasibly manufactured, the much higher component densities that ensue from combining together nanoscale components necessitate much different strategies related to removing waste heat produced by the circuits. In addition, the electronic properties of substances may change dramatically at nanoscale dimensions, so that different types of approaches and substances may need to be employed for fabricating even relatively simple, well-known circuits and subsystems at nanoscale dimensions. For example, the electronic properties of certain microscale electrical components, such as diodes or field-effect transistors, that can be used to fabricate microscale logic gates may not be obtainable at nanoscale dimensions. Thus, designers, manufacturers, and users of logic circuits have recognized the need for new nanoscale electronic components that can be used to fabricate electronic-based logic gates.

SUMMARY OF THE INVENTION

Various embodiments of the present invention are directed to nanowire crossbars that use configurable, tunneling resistor junctions to electronically implement logic gates. In one embodiment of the present invention, a nanowire crossbar comprises two or more layers of approximately parallel nanowires, and a number of configurable, tunneling resistor junctions that each interconnects a nanowire in a first layer of approximately parallel nanowires with a nanowire in a second layer of approximately parallel nanowires.

BRIEF DESCRIPTION OF THE DRAWINGS

FIG. 7A shows a schematic representation of an AND logic gate.

FIG. 7B illustrates a truth table that represents possible inputs and outputs associated with the AND logic gate shown in FIG. 7A.

FIG. 8A illustrates an exemplary nanowire crossbar that is configured to implement the AND logic gate shown in FIGS. 7A-7B and that represents one of many embodiments of the present invention.

FIG. 9A shows a schematic representation of an OR logic gate.

FIG. 9B shows a truth table that represents possible inputs and outputs associated with the OR logic gate shown in FIG. 9A.

FIG. 10A illustrates an exemplary nanowire crossbar that is configured to implement the OR logic gate shown in FIGS. 9A-9B and that represents one of many embodiments of the present invention.

FIG. 10B shows a truth table corresponding to an example simulation of the OR logic gate that is shown in FIG. 10A that represents one of many embodiments of the present invention.

FIG. 13B shows a truth table corresponding to an example simulation of the logic gates that are shown in FIG. 13A and that represents one of many embodiments of the present invention.

DETAILED DESCRIPTION OF THE INVENTION

Various embodiments of the present invention are directed to nanowire crossbars that use configurable, tunneling resistor junctions to electronically implement logic gates, including AND, OR, exclusive OR ("XOR"), and NOT AND ("NAND") logic gates. In order to assist in understanding descriptions of various embodiments of the present invention, an overview of crossbar arrays is provided below, in a first subsection. In a second subsection, an overview of properties of nonlinear resistors is provided. Finally, in a third subsection, various device and method embodiments of the present invention are described.

Crossbar Arrays and Nanowire Junctions

Figure 1:
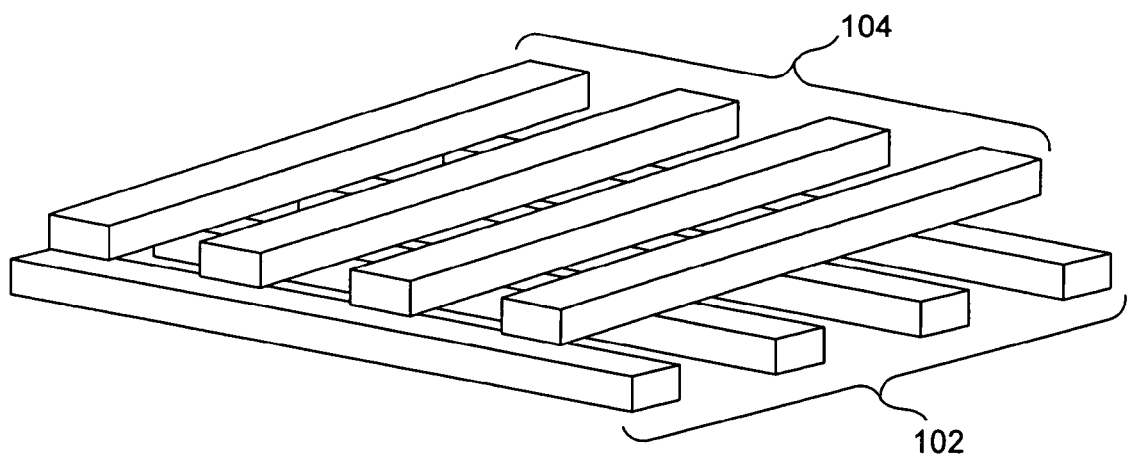
FIG. 1 illustrates a nanowire crossbar array.

FIG. 1 illustrates a nanowire crossbar array. In FIG. 1, a first layer of approximately parallel nanowires 102 is overlain by a second layer of approximately parallel nanowires 104. The second layer 104 is roughly perpendicular, in orientation, to the nanowires of the first layer 102, although the orientation angle between the layers may vary. The two layers of nanowires form a lattice, or crossbar, each nanowire of the second layer 104 overlying all of the nanowires of the first layer 102 and coming into close contact with each nanowire of the first layer 102 at nanowire intersections that represent the closest contact between two nanowires. Although individual nanowires in FIG. 1 are shown with rectangular cross sections, nanowires can also have square, circular, elliptical, or more complex cross sections. The nanowires may also have many different widths or diameters and aspect rations or eccentricities. The term "nanowire crossbar" may refer to crossbars having one or more layers of sub-microscale, microscale, or wires with larger dimensions, in addition to nanowires.

Nanowire layers can be fabricated by mechanical nanoimprinting techniques. Alternatively, nanowires can be chemically synthesized and can be deposited as layers of approximately parallel nanowires in one or more process steps, including Langmuir-Blodgett processes. Other alternative techniques for fabricating nanowires may also be employed.

Thus, a two-layer nanowire crossbar comprising first and second layers, as shown in FIG. 1, can be manufactured by any of numerous relatively straightforward processes. Many different types of conductive and semi-conductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits.

Figure 2A:
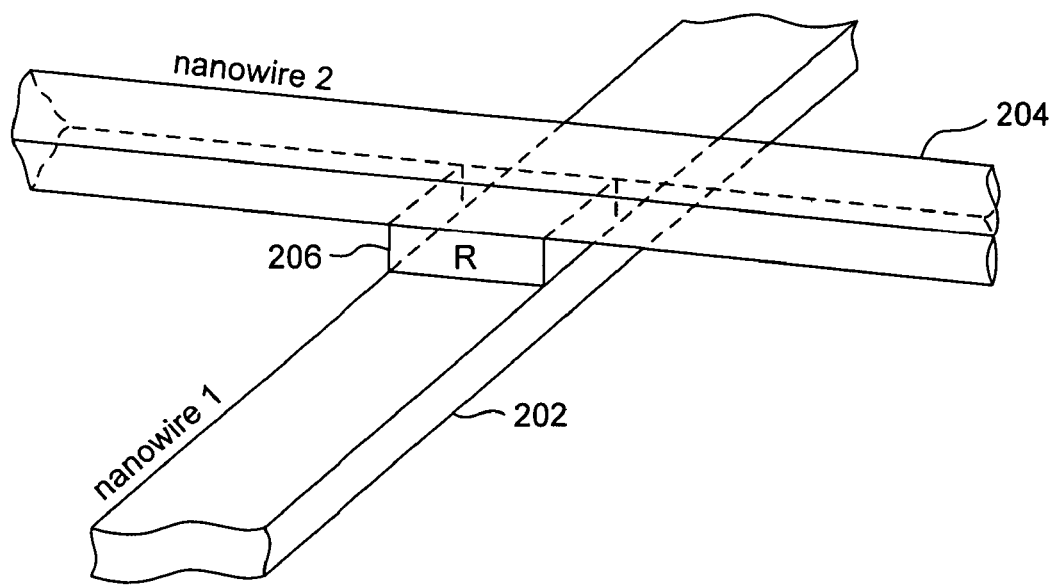
FIGS. 2A-2B provide two different illustrations of a nanowire junction that interconnects nanowires of two contiguous layers within a nanowire crossbar.
Figure 2B:
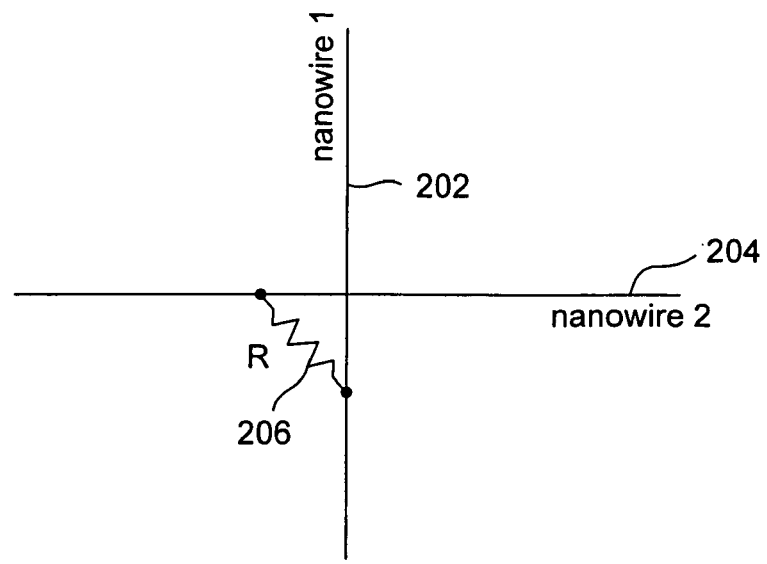

At nanowire intersections, nanoscale electronic components, such as resistors, and other familiar basic electronic components, can be fabricated to interconnect two overlapping nanowires. FIGS. 2A-2B provide two different illustrations of a nanowire junction that interconnects nanowires 202 and 204 of two contiguous layers within a nanowire crossbar. The nanowire junction may or may not involve physical contact between the two nanowires 202 and 204. As shown in FIG. 2A, the two nanowires are not in physical contact at their overlap point, but the gap between the nanowires 202 and 204 is spanned by a number of molecules represented by resistive element 206 that lies between the two nanowires at their closest point of contact. The resistive element 206 may be composed or one or more molecules that behave as a resistor. In certain embodiments of the present invention, the resistive element 206 may be introduced in a separate layer, referred to as "intermediate layer," formed between the layers of overlapping nanowires and configured, as described below with reference to FIGS. 3A-3D.

The electronic properties, such as resistance, of nanowire-junction molecules can vary according to the particular molecular configuration or electronic state of the nanowire-junction molecules. In some cases, changes in the state of nanowire-junction molecules may not be reversible. In other cases, the nanowire-junction molecules may be conductive, but the molecules may be irreversibly damaged, along with portions of the nanowires proximal to the nanowire junctions, through application of very high voltages, resulting in disrupting conductivity between the two nanowires and breaking an electrical connection between them. In yet other cases, the nanowire-junction molecules may transition reversibly from one state to another and back, so that the resistive elements configured at nanowire junctions may be reconfigured, or programmed, by application of differential voltages to selected nanowire junctions. FIG. 2B illustrates a schematic representation of the resistive element 206 and overlapping nanowires 202 and 204 shown in FIG. 2A. The schematic representation shown in FIG. 2B is used to represent resistive nanowire junctions throughout the remaining figures.

Various different types of molecules may be introduced at nanowire junctions for a variety of different purposes, such as to control the level of current passing between two overlapping nanowires. The molecules spanning a nanowire junction, as shown in FIG. 2A, may have various different states in which the molecules exhibit resistive, semiconductor-like, or conductive electrical properties. The states, and relative energies of the states, of the nanowire-junction molecules may be controlled by applying differential current levels or voltages to the overlapping nanowires forming the nanowire junction. For example, certain states of a nanowire-junction molecule can be set by applying voltages to nanowires of a nanowire junction. The applied voltages can change the redox state of the nanowire-junction molecule causing the nanowire-junction molecule to operate as a conductor in a reduced state or operate as an insulator in an oxidized state.

Figure 3A:
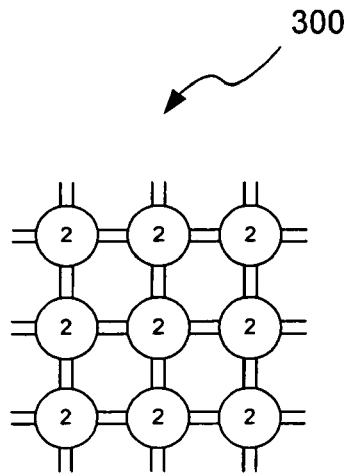
FIGS. 3A-3D illustrate one possible approach to configuring a network of reconfigurable nanoscale electrical components from a two-layer nanowire crossbar.
Figure 3B:
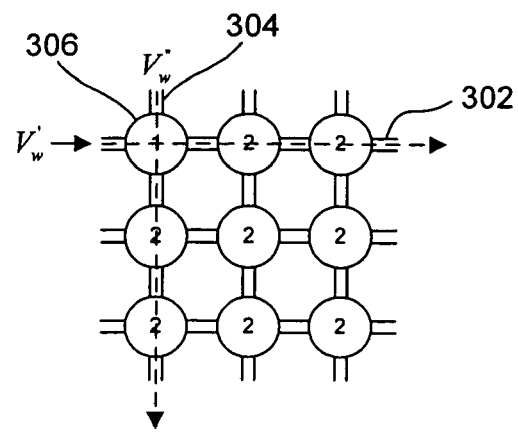
Figure 3C:
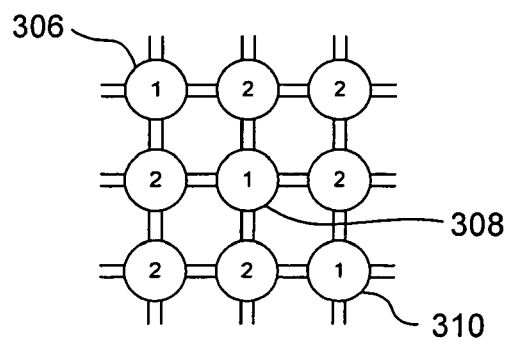
Figure 3D:
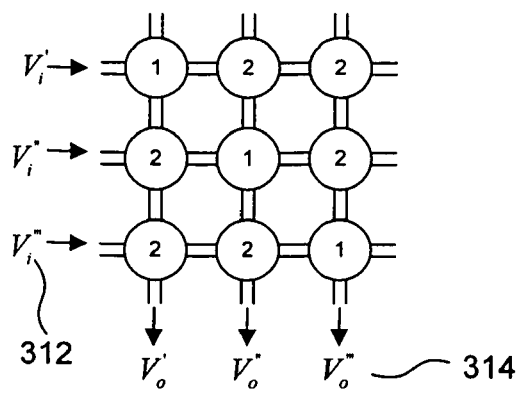

Nanowire junctions can be configured electrically, optically, mechanically or by other means. FIGS. 3A-3D illustrate one possible approach to configuring a network of reconfigurable nanoscale electrical components from a two-layer nanowire crossbar. The example of FIGS. 3A-3D are meant to illustrate a general process by which nanowire crossbars may be configured as useful portions of electronic circuits. In FIGS. 3A-3D, a small 3×3 nanowire crossbar is shown, with circles at all nine nanowire junctions, each circle indicating the state of the nanowire-junction molecules. In one state, labeled "1" in FIGS. 3A-3D, the nanowire-junction molecules may have resistive properties, while in a second state, labeled "2" in FIGS. 3A-3D, the nanowire-junction molecules may have different properties that cause the nanowire-junction molecules to acts a insulators. Initially, as shown in FIG. 3A, the states of the nanowire junctions of the nanowire crossbar 300 are labeled "2." Next, as shown in FIG. 3B, each nanowire junction may be uniquely accessed by applying a WRITE voltage, or configuring voltage, to the nanowires that form the nanowire junction in order to configure, or program, the nanowire junction to have the state "1." For example, in FIG. 3B, a first WRITE voltage $v_w'$ is applied to horizontal nanowire 302 and a second WRITE voltage $v_w''$ is applied to vertical nanowire 304 to change the state of the nanowire junction 306 from "2" to "1." Individual nanowire junctions may be configured through steps similar to the steps shown in FIG. 3B, resulting in a fully configured nanoscale component network as shown in FIG. 3C. In FIG. 3C, the states of nanowire junctions 306, 308, and 310 form a downward-slanted diagonal through the nanowire crossbar that have been configured by selective application of WRITE voltages. As shown in FIG. 3D, the nanoscale electrical component network can be used as a portion of an integrated circuit. Input voltages $v_i'$, $v_i''$, and $v_i'''$ may be applied to the nanoscale electrical component lattice as inputs 312 and output voltages $v_o'$, $v_o''$, and $v_o'''$ 314 may be accessed as the result of operation of the nanoscale electrical component network that represents a portion of an integrated circuit. In general, the input voltages $v_i'$, $v_i''$, and $v_i'''$ and the output voltages $v_o'$, $v_o''$, and $v_o'''$ have relatively low magnitudes compared with the WRITE voltages $v_w$. Depending on the types of nanowires, types of dopants employed in the case of semiconductor nanowires, and the types of nanowire-junction molecules employed in the nanowire crossbar, many different configuring processes may be used to configure nanowire crossbars into nanowire-based electrical components networks.

Properties of Nonlinear Tunneling Resistor Junctions

A current flowing between two overlapping nanowires interconnected by nanowire-junction molecules that operate as a nonlinear tunneling resistor can be modeled by the current-voltage equation:

$$I = \frac{1}{2}(ke^{aV} - ke^{-aV}) = k\sinh(aV)$$

where I is current flowing through the nanowire junction,
  V is a voltage across the nanowire junction,
  k is the conductance of the nanowire junction, and
  a is a scale factor.

Figure 4:
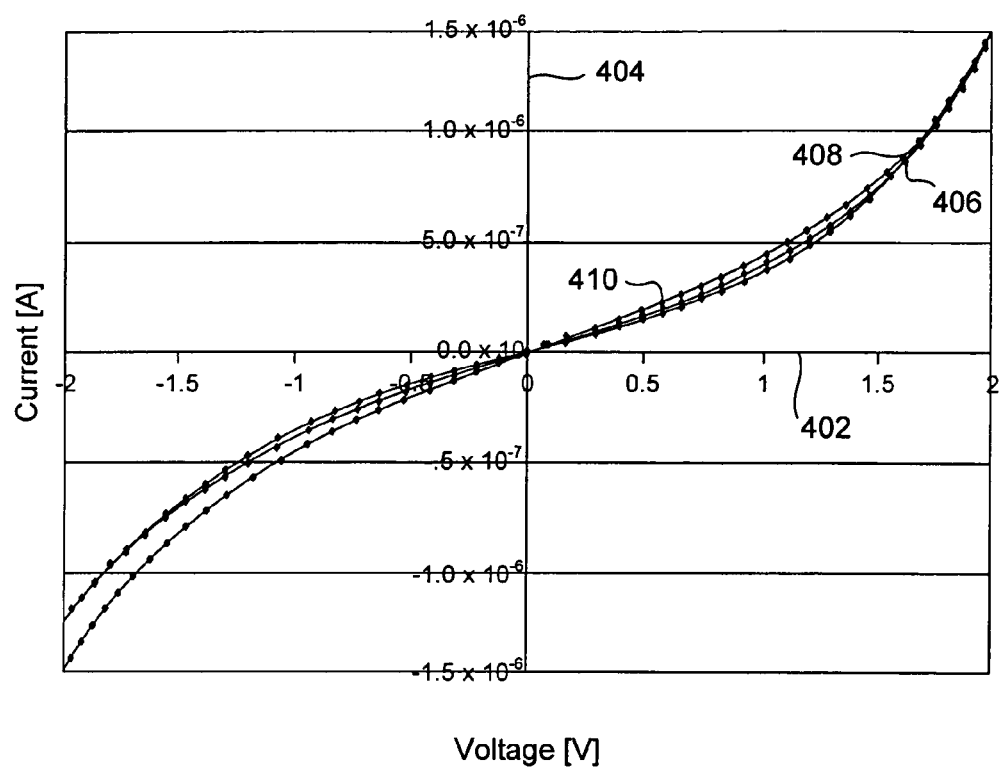
FIG. 4 shows a current-versus-voltage plot that describes operation of a nanoscale, tunneling resistor junction fabricated in a crossbar array.

The conductance, k, and scale factor, a, are parameters determined by the physical properties of nanowire-junction molecules. The scale factor, a, represents resistive properties of the nanowire junction and can be used to characterize changes in the current flowing through the nanowire junction based on changes in the voltages between the overlapping nanowires. The parameter k is analogous to the conductance, g=1/R, of a linear resistor, where R represents resistance. Nonlinear tunneling resistors that operate in accordance with the current-voltage equation given above are also referred to as "tunneling resistors." FIG. 4 shows a current-versus-voltage plot of data that describes operation of a nanoscale, tunneling resistor junction fabricated in a crossbar array. In FIG. 4, horizontal line 402 represents a voltage axis, and vertical line 404 represents a current axis. Curves 406 and 408 are plots of two current-versus-voltage data sets obtained by application of voltages between −2V and 2V to a nanoscale, tunneling resistor junction of dimensions 75 nm by 30 nm. Curve 410 is a plot of a current-voltage equation that has been fit to the data represented by curves 406 and 408 and that is mathematically represented by:

$$I = 2 \times 10^{-7} \sinh(1.3455V)$$

The curve 410 shows that the current-voltage equation is a good representation of nanoscale tunneling resistors fabricated at nanowire junctions in crossbar arrays. The nonlinear properties of tunneling resistor molecules, shown in FIG. 4, are the result of quantum-mechanical tunneling of electrons through relatively low-energy, unoccupied quantum states of the nanowire-junction molecules. In FIG. 4, the current versus voltage curves exhibit inversion symmetry at the origin. The inversion symmetry results from the fact that reversing the voltages applied to overlapping nanowires of a tunneling resistor junction changes the direction of current flow, but does not affect the magnitude of the current, |I|, flowing through the tunneling resistor junction.

Figure 5:
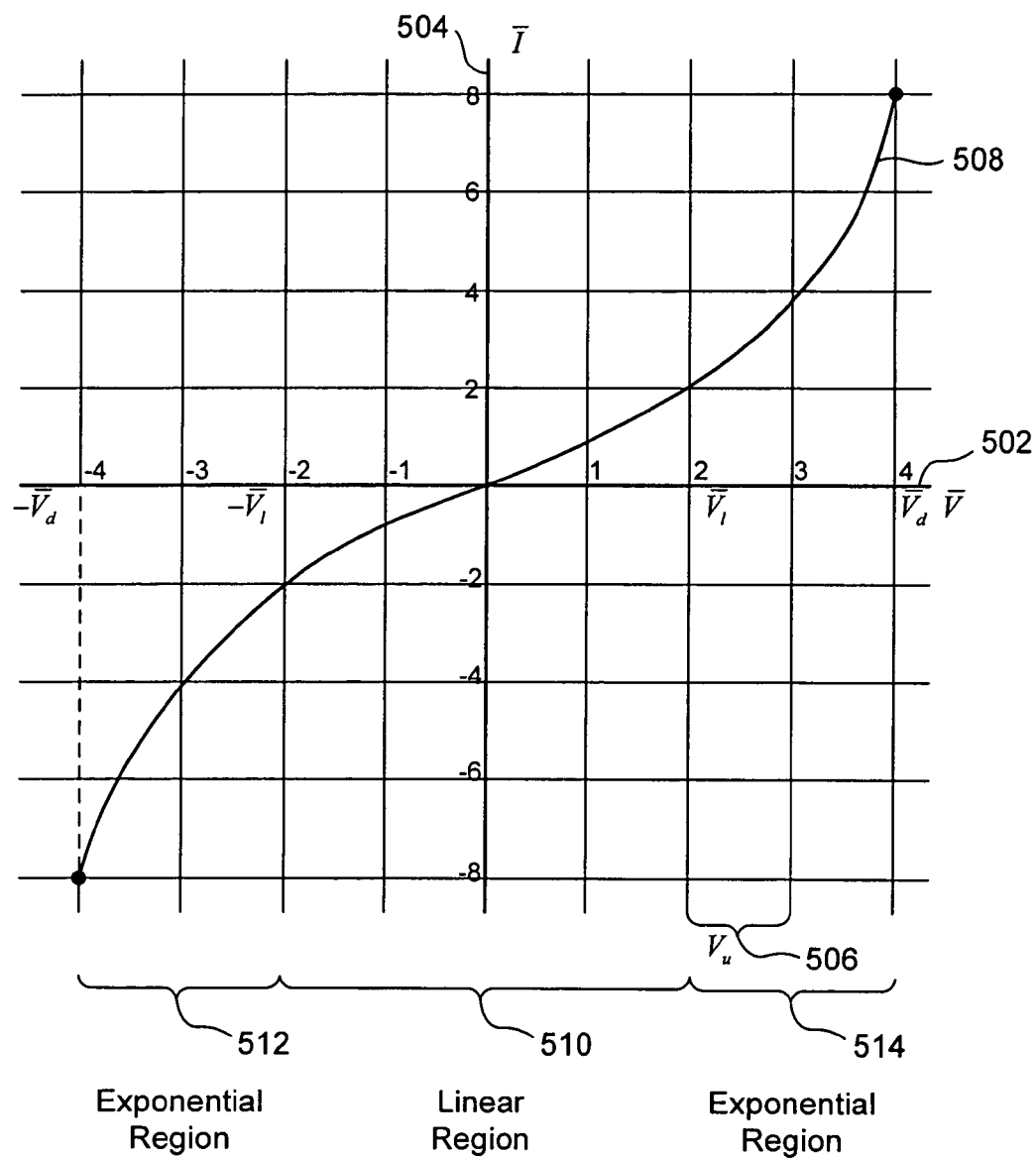
FIG. 5 shows a current-versus-voltage curve that describes the operational characteristics of a tunneling resistor junction.

FIG. 5 shows a current-versus-voltage curve that describes the operational characteristics of a tunneling resistor junction. In FIG. 5, horizontal line 502 represents a normalized voltage axis, and vertical line 504 represents a normalized current axis. The voltages represented are normalized according to:

$$\overline{V} = \frac{V}{V_u},$$

where $V_u$ 506 equals ln 2/a and is referred to as the "unit voltage step." The currents are normalized according to:

$$\overline{I} = \frac{I}{k}$$

Curve 508 represents a normalized current-voltage for a tunneling resistor junction, operation of which is expressed by:

$$\overline{I} = \sinh(a\overline{V}) = \sinh\frac{V\ln 2}{V_u}$$

The curve 508 shows qualitatively different regions of behavior that are identified as a linear region 510 and two exponential regions 512 and 514. In the linear region 510, the curve 508 shows a nearly linear current-versus-voltage relationship that can be approximated by:

$$\bar{I} \cong k \cdot a \cdot \bar{V}$$

for $|\bar{V}| < |\bar{V}_l|$, where $\pm \bar{V}_l$ are linear current-versus-voltage threshold voltages. The linear region 510 indicates that for voltages with magnitudes less than the linear threshold voltage magnitude, $|\bar{V}_l|$, the tunneling resistor junction operates as a linear resistor junction with a conductance ka. The linear region 510 also shows that as the magnitude of the voltage across a tunneling resistor junction decreases, the resistance of the nanowire junction is nearly constant. As a result, the magnitude of the current flowing through the tunneling resistor junction decreases to zero. By contrast, in the exponential regions 512 and 514, the curve 508 shows a nonlinear current-versus-voltage relationship that can be approximated by:

$$\bar{I} \cong \text{sgn}(\bar{V}) \cdot k \cdot 2^{|\bar{V}|-1}$$

for $|\bar{V}| \geq |\bar{V}_l|$. The exponential regions 512 and 514 show that for voltages with magnitudes greater than the threshold voltage, $|\bar{V}_l|$, the resistance of a tunneling resistor junction decreases, and the current flowing through the nanowire junction increases exponentially. Voltages, $\pm \bar{V}_d$, represent the lower and upper bounds of a domain of normalized voltages that can be applied to tunneling resistor junctions. Applying voltages that are greater than $|\bar{V}_d|$ to a tunneling resistor junction irreversibly damages the molecules spanning the junction, rendering the junction inoperable and breaking the electrical connection between overlapping nanowires.

Embodiments of the Present Invention

Electrical devices typically process information by implementing two-state Boolean algebraic operations on binary logical values represented by "0" and "1." Boolean operations are performed with logic gates. In certain implementations employing diodes, the binary logical values are represented with low and high voltages or current levels. A diode is an electric component that does not allow current to flow in a forward bias direction unless the voltage applied in the forward direction is greater than a forward-bias threshold.

Figure 6:
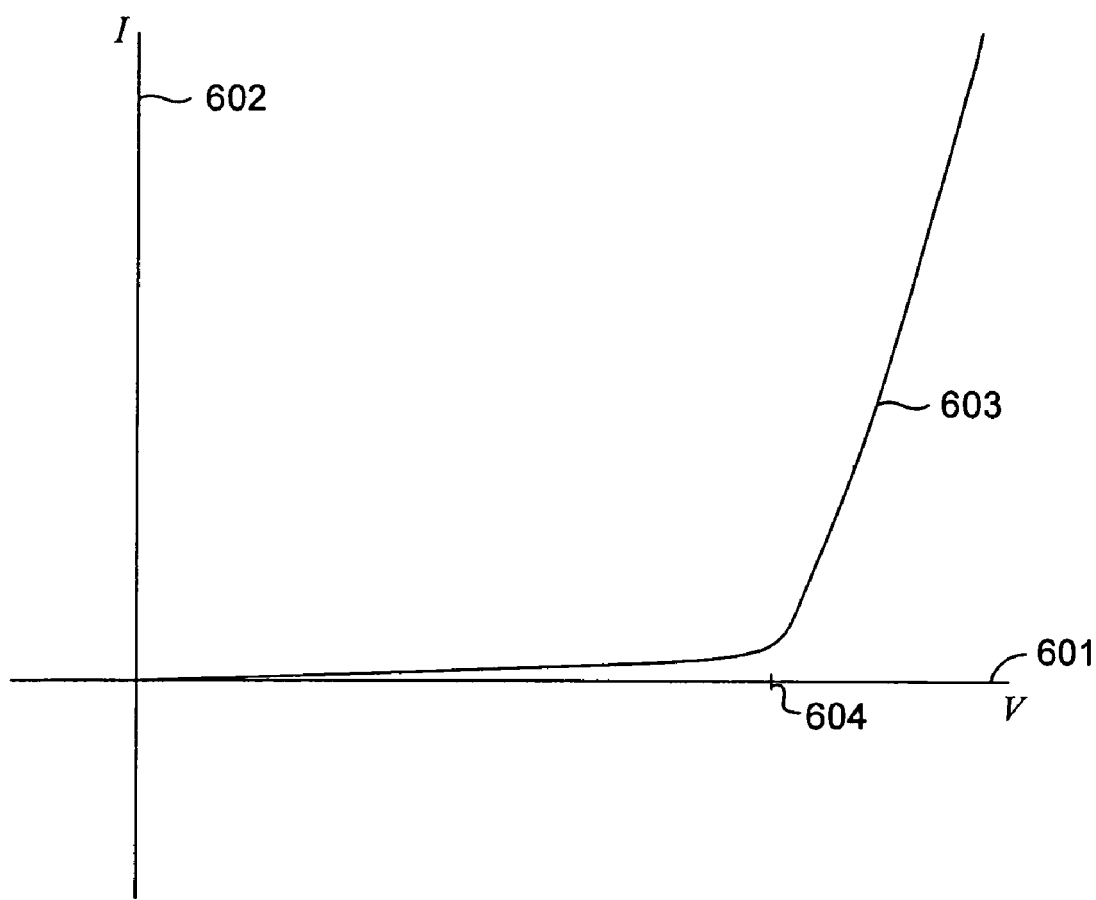
FIG. 6 shows a current-versus-voltage curve for a diode.

FIG. 6 shows a current-versus-voltage curve for a diode. In FIG. 6, horizontal line 601 represents the voltage axis, and vertical line 602 represents the current axis. Curve 603 represents the amount of current flowing through a diode in the forward-bias direction. When a voltage applied to the diode is less than forward-bias threshold 604, the resistance of the diode is high and a very small amount of current passes, as indicated by the nearly zero current for voltages less than the forward-bias threshold 604. However, when a voltage applied to the diode is greater than the forward-bias threshold 604, the resistance of the diode is lowered and significant current passes, as indicated by the steep increase in the curve 603 for voltage levels greater than the forward-bias threshold 604. Microscale and larger electronic AND and OR logic gates can be implemented either by associating the logical value "0" with voltage levels that are less than the forward-bias threshold and the logical value "1" with voltage levels that are greater than the forward-bias threshold, or by using an opposite convention. However, implementation of nanoscale AND and OR logic gates using diode logic is currently problematic. For example, fabricating dependable diode-like nanowire-junction molecules between nanowires may not be technically feasible, in certain cases, or may introduce sufficient additional manufacturing costs to make nanowire crossbar manufacturing too expensive. Tunneling resistor junctions may be used as alternatives to diode-like nanowire junctions for nanowire crossbar implementations of logic gates, because the resistive properties of the tunneling resistor junctions approximates the resistive properties of microscale diodes, and because tunneling resistor junctions may be more readily and more economically manufactured.

Embodiments of the present invention are directed to nanowire crossbar implementations of logic gates using tunneling resistor junctions. The logic gate implementations receive voltages and output voltages that represent logical values "0" and "1." For example, in FIG. 5, a negative voltage in the exponential region 512 can be selected to operate as input logical value "0," and a positive voltage in the exponential region 514 can be selected to operate as input logical value "1." The magnitudes and polarities of the voltages that represent input logical values "0" and "1" may be different from the magnitudes and polarities of the voltages that represent output logical values "0" and "1."

FIG. 7A shows the schematic representation of an AND logic gate. In FIG. 7A, AND logic symbol 702 represents a logic AND gate operation that converts two input logical values, represented symbolically by A and B, into a single output logical value, represented symbolically by AB. FIG. 7B illustrates a truth table that represents possible inputs and outputs associated with the AND logic gate shown in FIG. 7A. As shown in FIG. 7B, when either logical input A or B is logical value "0," the AND logic gate outputs the logical value "0," and when both logical inputs A and B are logical value "1," the AND logic gate outputs the logical value "1."

FIG. 8A illustrates an exemplary nanowire crossbar 800 that is configured to implement the AND logic gate shown in FIGS. 7A-7B and that represents one of many embodiments of the present invention. In FIG. 8A, and in subsequent figures, a vertical line, such as vertical line 802, represents a vertical nanowire from a first layer of approximately parallel nanowires, and a horizontal line, such as horizontal line 804, represents a horizontal nanowire from a second layer of approximately parallel nanowires. Shaded circles, such as shaded circle 806, represent identical tunneling resistor junctions. Horizontal nanowires 808 and 810 serve as input signal lines, and a pull-up voltage, denoted by V+, is applied to horizontal nanowire 804. The nanowire crossbar 800 output can be obtained by measuring the voltage or level of current on the vertical nanowire 802.

Figure 8B:
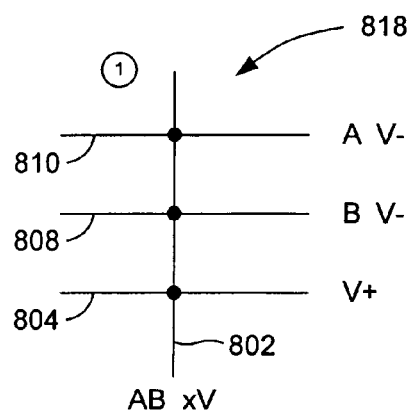
FIG. 8B illustrates a hypothetical implementation of the AND logic gate shown in FIG. 8A that represents one of many embodiments of the present invention.
Figure 8B:
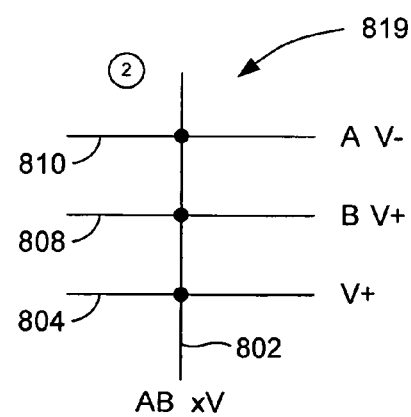
Figure 8B:
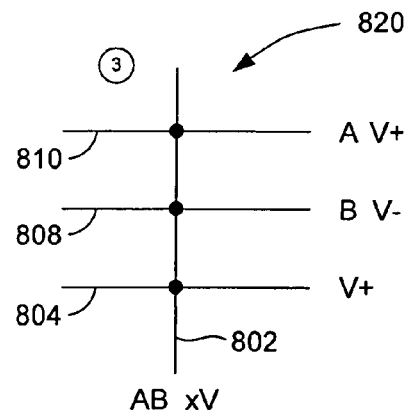
Figure 8B:
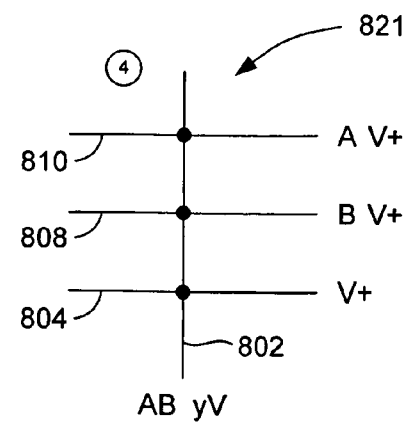

FIG. 8B illustrates a hypothetical implementation of the AND logic gate shown in FIG. 8A that represents one of many embodiments of the present invention. In the truth table 812, rows 814-817 are labeled with circled numbers 1, 2, 3, and 4, respectively, that correspond to identically labeled nanowire crossbars 818-821. In the nanowire crossbars 818-821, positive voltages V+ represent the input logical value "1," and negative voltages V− represent the input logical value "0," applied to the horizontal nanowire 808 and 810. For example, in the row 814, both of the input logical values are "0," which, in turn, correspond to the negative voltages applied to the horizontal nanowires 808 and 810 in the nanowire crossbar 818. The output AB is obtained by measuring the voltage on the vertical nanowire 802. The horizontal nanowires in the nanowire crossbars 818-820 that carry negative input voltages serve as voltage sinks, which pull down the magnitude of the voltage carried by the vertical nanowire 802. Because the horizontal nanowires of the nanowire crossbar 821 all carry positive input voltages, the magnitude of the voltage yV on the vertical nanowire of nanowire crossbar 821 is larger than the magnitude of the voltage xV carried by the vertical nanowires in nanowire crossbars 818-820. As a result, the higher magnitude voltage yV carried by the vertical nanowire in nanowire crossbar 821 represents the output logical value "1," and the lower magnitude voltage xV carried by the vertical nanowires in the nanowire crossbars 818-820 represent the output logical value "0."

Tunneling resistor junctions can be incorporated into nanowire crossbars in order to implement an OR logic gate. FIG. 9A shows a schematic representation of an OR logic gate. In FIG. 9A, OR logic symbol 902 represents a logic OR gate operation that converts two input logical values into a single output logical value, represented symbolically as A+B. FIG. 9B shows a truth table that represents possible inputs and outputs associated with the OR logic gate shown in FIG. 9A. In FIG. 9B, when one or both of the input logical values are "1," the OR gate outputs the logical value "1," and when both of the logic input values are "0," the OR gate outputs the logical value "0."

FIG. 10A illustrates an exemplary nanowire crossbar 1000 that is configured to implement the OR logic gate that is shown in FIGS. 9A-9B and that represents one of many embodiments of the present invention. Horizontal nanowires 1002 and 1004 serve as input signal lines, and horizontal nanowire 1006 serves as an output signal line. In order to establish distinguishable reference levels for output voltages that correspond to output logical values "0" and "1," pull-up voltages, V+, are applied to horizontal nanowires 1008 and 1010, and a pull-down voltage, denote by V−, is applied to vertical nanowire 1012. FIG. 10B shows a truth table corresponding to an example simulation of the OR logic gate shown in FIG. 10A that represents one of many embodiments of the present invention. In FIG. 10B, input voltages −2V and 2V represent input logical values "0" and "1," respectively, and output voltages ~−0.9V and ~0V represent output logical values "0" and "1," respectively, where the symbol "~" means approximate value. The pull-up and pull-down voltages are 1V and −1V, respectively. The current-voltage representation of the tunneling resistor junctions shown in FIG. 10A, and in subsequent example simulations of nanowire-logic-gate implementations described below, is given by:

$$I = 6 \times 10^{-8} \sin h(3V)$$

The results displayed in the truth table indicate that the input voltages representing input logical values need not match the output voltages representing output logical values, in order for the nanowire crossbar 1000 to operate as an OR logic gate.

Figures 11A, 11B:
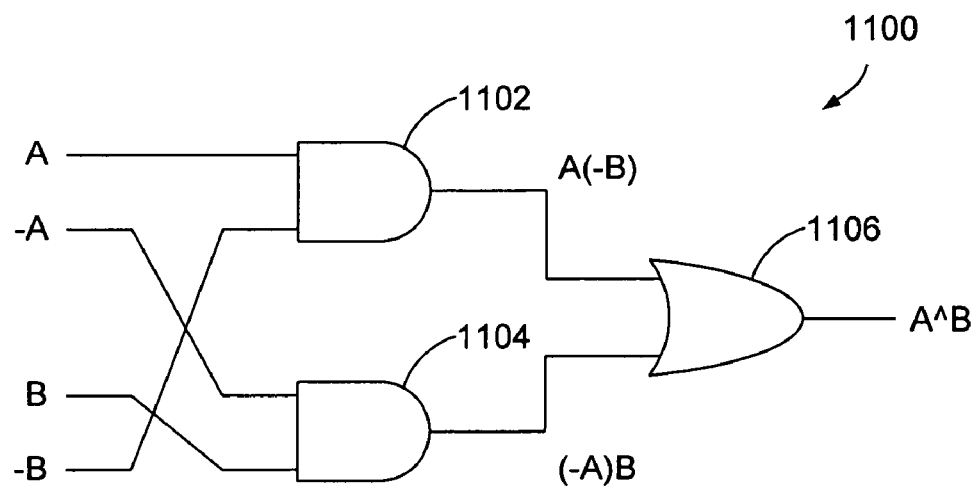
FIG. 11A shows a schematic representation of an exclusive OR logic gate comprising two AND logic gates and an OR logic gate.
FIG. 11B illustrates a truth table that represents possible inputs and possible outputs associated with the exclusive OR logic gate shown in FIG. 11A.

In alternate embodiments of the present invention, the AND and OR logic gates, described above with reference to FIGS. 7A-10B, can be combined in order to implement other logic gates, such as an XOR logic gate. FIG. 11A shows a schematic representation of an XOR logic gate 1100 comprising two AND logic gates 1102 and 1104 and an OR logic gate 1106. In FIG. 11A, the XOR logic gate 1100 receives as input the logical values A and B and also receives complements of the input logical values, represented by −A and −B, respectively. For example, when logical input A represents logical value "0," the complement −A represents logical value "1." The XOR logic gate 1100 outputs a single logical value symbolically represented by A^B. FIG. 11B illustrates a truth table that represents possible inputs and possible outputs associated with the XOR logic gate shown in FIG. 11A. In FIG. 11B, when both of the input logical values for A and B are the same, the output logical value of the XOR logic gate 1100 is "0," and when both of the input logical values for A and B are different, the output logical value of the XOR logic gate 1100 is "1."

Figures 12A, 12B:
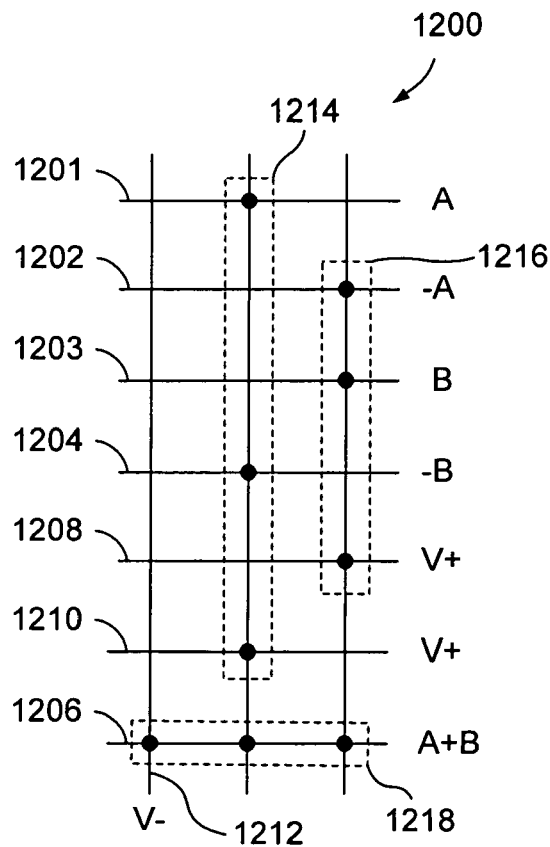
FIG. 12A illustrates a nanowire crossbar that is configured to implement the exclusive OR logic gate shown in FIGS. 11A-11B and that represents one of many embodiments of the present invention.
FIG. 12B shows a truth table corresponding to an example simulation of the exclusive OR logic gate that is shown in FIG. 12A that represents one of many embodiments of the present invention.

FIG. 12A illustrates a nanowire crossbar 1200 that is configured to implement the exclusive OR logic gate that is shown in FIGS. 11A-11B and that represents one of many embodiments of the present invention. In FIG. 12A, horizontal nanowires 1201-1204 serve as input signal lines, and horizontal nanowire 1206 serves as an output signal line. Pull-up voltages are applied to horizontal nanowires 1208 and 1210 and pull-down voltages are applied to vertical nanowire 1212, in order to establish reference voltage levels representing output logical values "0" and "1." The XOR logic gate 1200 is implemented using two AND logic gates 1214 and 1216 that correspond to the AND logic gate symbols 1102 and 1104 in FIG. 11A, respectively, and an OR logic gate 1218 that corresponds to the OR logic gate symbol 1106 in FIG. 11A. FIG. 12B shows a truth table corresponding to an example simulation of the XOR logic gate shown in FIG. 12A that represents one of many embodiments of the present invention. In FIG. 12B, the input voltages −2V and 2V represent input logical values "0" and "1," respectively, and the output voltages ~−0.9V and ~0V represent output logical values "0" and "1," respectively.

Figure 13A:
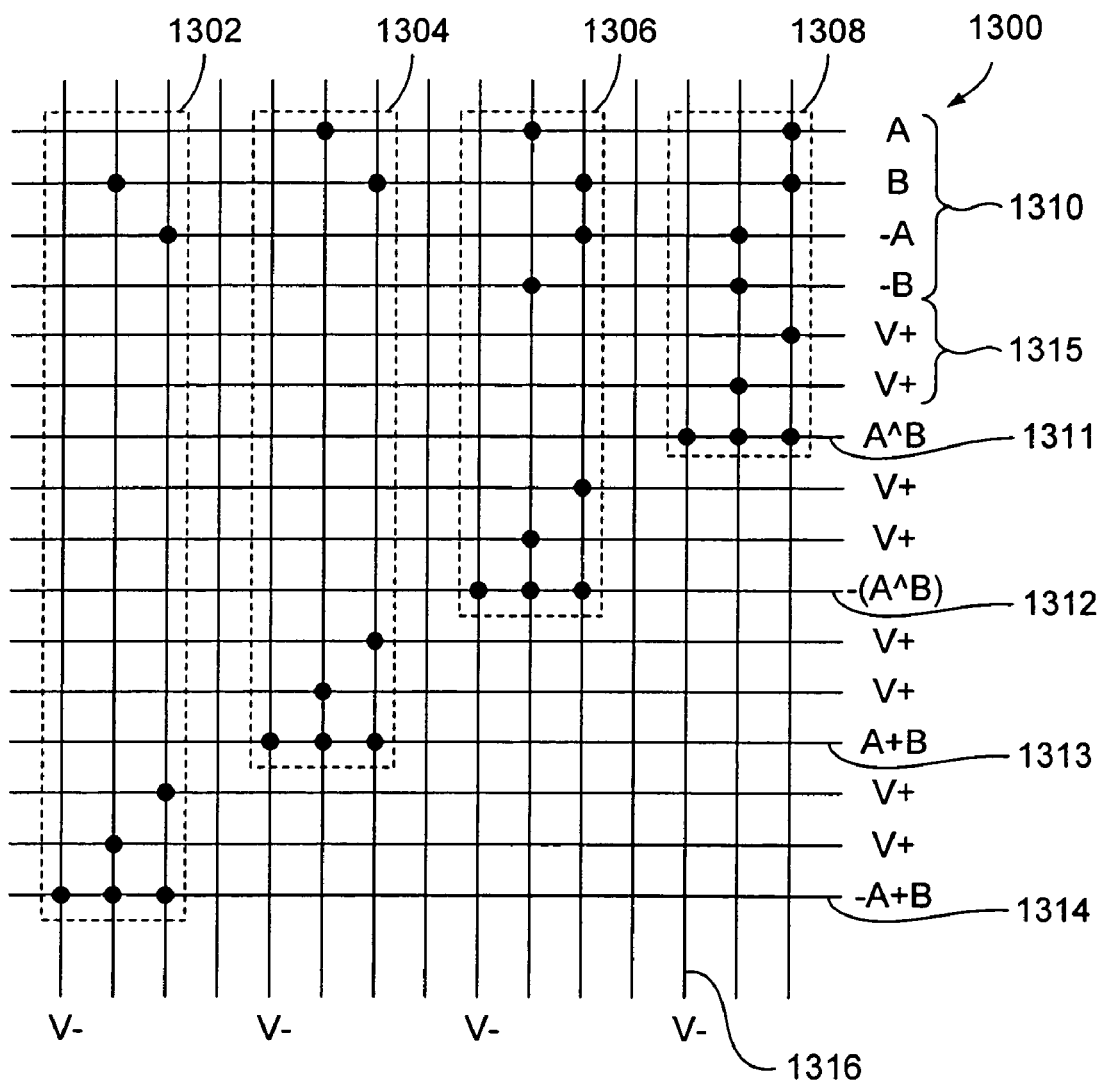
FIG. 13A illustrates a nanowire crossbar that includes four separate and independently operating logic-gate implementations that represents one of many embodiments of the present invention.

In alternate embodiments of the present invention, a nanowire crossbar may include two or more implementations of logic gates that each operate independently. FIG. 13A illustrates a nanowire crossbar that includes four separate and independently operating logic-gate implementations that represents one of many embodiments of the present invention. In FIG. 13A, nanowire crossbar 1300 includes two separate OR logic gates 1302 and 1304, an XOR logic gate 1306, and a NOT XOR ("XNOR") logic gate 1308. Horizontal nanowires 1310 serve as input signal lines, and horizontal nanowires 1311-1314 serve as output signal lines. Each logic gate includes horizontal and vertical nanowires that serve as inputs for pull-up and pull-down voltages. For example, XNOR logic gate 1308 includes horizontal nanowires 1315 that receive pull-up voltages, and a vertical nanowire 1316 that receives a pull-down voltage. FIG. 13B shows a truth table corresponding to an example simulation of the logic gates that are shown in FIG. 13A and that represents one of many embodiments of the present invention. In FIG. 13B, the input voltages −2V and 2V represent input logical values "0" and "1," respectively. The output logic values listed in columns 1320-1323 correspond to the voltages output on horizontal signal lines 1311-1314, respectively, shown in FIG. 13A.

Figure 14:
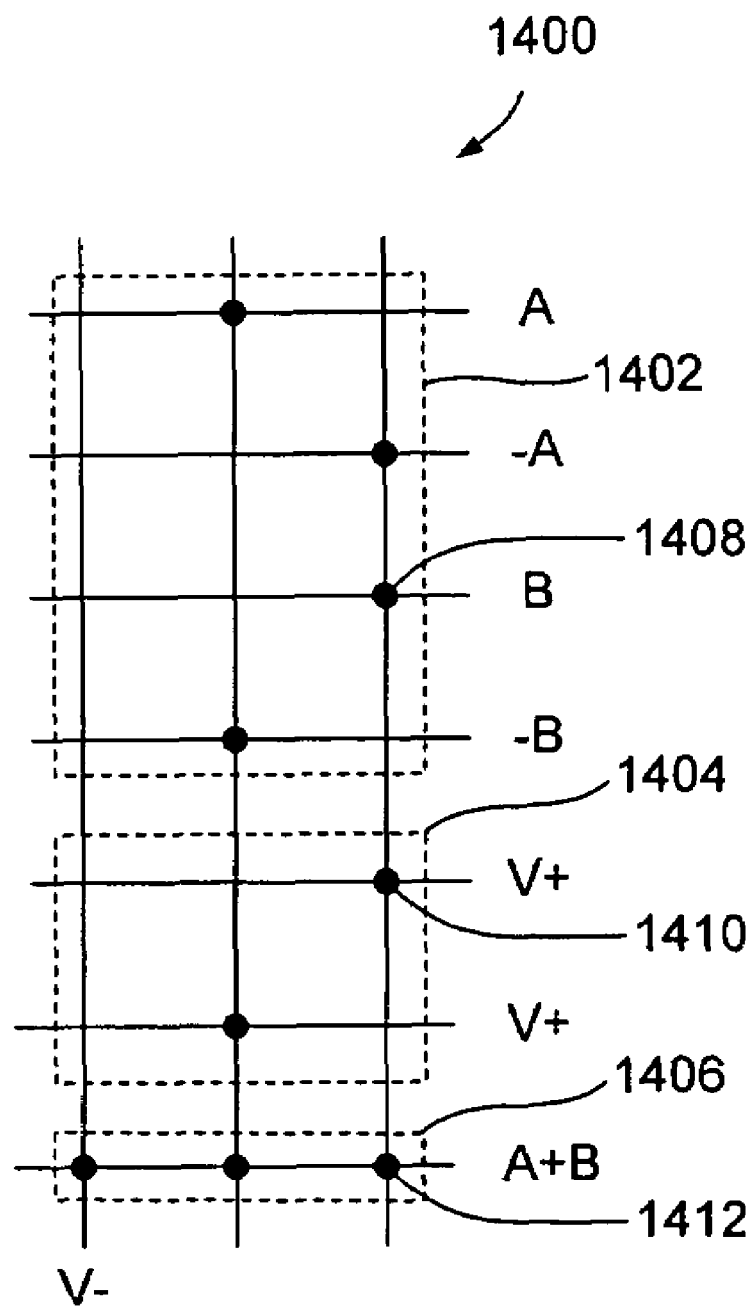
FIG. 14 illustrates a nanowire crossbar that implements an exclusive OR logic gate with three separate microregions that represents one of many embodiments of the present invention.

Although the present invention has been described in terms of particular embodiments, it is not intended that the invention be limited to these embodiments. Modifications within the spirit of the invention will be apparent to those skilled in the art. In alternate embodiments of the present invention, the interlayer between the overlapping layers of nanowires can be subdivided in subregions or microregion, where each microregion comprises a chemically different interlayer so that nonlinear, resistive properties of nanowire junctions can be varied from microregion to microregion. The term "microregion" refers to a scale larger than an individual nanowire junction, but not necessarily to a particular range of dimensions. FIG. 14 illustrates a nanowire crossbar that implements an XOR logic gate with three separate microregions that represents one of many embodiments of the present invention. In FIG. 14, the XOR logic gate 1400 comprises three distinct microregions 1402, 1404, and 1406. The interlayers comprising the microregions 1402, 1404, and 1406 are each chemically different so that the tunneling resistor junctions, such as nanowire junctions 1408, 1410, and 1412, have different nonlinear resistive properties.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. A crossbar that implements an AND logic gate, the crossbar comprising:
    a nanowire crossbar with two or more layers of approximately parallel nanowires;
    a number of configurable, tunneling resistor junctions that each interconnects a nanowire in a first layer of approximately parallel nanowires with a nanowire in a second layer of approximately parallel nanowires, wherein the tunneling resistors have current-to-voltage inversion symmetry;
    two nanowires in the first layer that each receive an electrical signal that represents an input logical value;
    a nanowire in the first layer that receives a pull-up voltage; and
    a nanowire in the second layer interconnected to the nanowires in the first layer, the nanowire in the second layer carries an electrical signal representing an AND logic gate output logic value.

2. The crossbar of claim 1 further comprising microregions, each microregion comprising a chemically different interlayer so that nonlinear, resistive properties of nanowire junctions can be varied from microregion to microregion.

3. A crossbar that implements an OR logic gate, the crossbar comprising:
    a nanowire crossbar with two or more layers of approximately parallel nanowires;
    a number of configurable, tunneling resistor junctions that each interconnects a nanowire in a first layer of approximately parallel nanowires with a nanowire in a second layer of approximately parallel nanowires, wherein the tunneling resistors have current-to-voltage inversion symmetry;
    two nanowires in the first layer, each receiving an electrical signal that represents a logical value;
    two nanowires in the first layer, each receiving a pull-up voltage;
    a nanowire in the second layer that receives a pull-down voltage; and
    a nanowire in the first layer that carries an electrical signal that represents an OR gate output logic value.

4. The crossbar of claim 3 further comprising microregions, each microregion comprising a chemically different interlayer so that nonlinear, resistive properties of nanowire junctions can be varied from microregion to microregion.

5. A crossbar that implements an exclusive OR logic gate, the crossbar comprising:
    a nanowire crossbar with two or more layers of approximately parallel nanowires;
    a number of configurable, tunneling resistor junctions that each interconnects a nanowire in a first layer of approximately parallel nanowires with a nanowire in a second layer of approximately parallel nanowires, wherein the tunneling resistors have current-to-voltage inversion symmetry;
    two nanowires in the first layer, each receiving an electrical signal that represents an input logical value;
    two nanowires in the first layer, each receiving an electrical signal that are complements of the input logical values;
    two nanowires in the first layer, each receiving a pull-up voltage;
    a nanowire in the second layer that receives a pull-down voltage; and
    a nanowire in the first layer that carries an electrical signal that represents an exclusive OR gate output logic value.

6. The crossbar of claim 5 further comprising microregions, each microregion comprising a chemically different interlayer so that nonlinear, resistive properties of nanowire junctions can be varied from microregion to microregion.

7. A crossbar that implements an exclusive not OR logic gate, the crossbar comprising:
    a nanowire crossbar with two or more layers of approximately parallel nanowires;
    a number of configurable, tunneling resistor junctions that each interconnects a nanowire in a first layer of approximately parallel nanowires with a nanowire in a second layer of approximately parallel nanowires, wherein the tunneling resistors have current-to-voltage inversion symmetry;
    two nanowires in the first layer, each receiving an electrical signal that represents an input logical value;
    two nanowires in the first layer, each receiving an electrical signal that complements of the input logical values;
    two nanowires in the first layer, each receiving a pull-up voltage;
    a nanowire in the second layer that receives a pull-down voltage; and
    a nanowire in the first layer that carries an electrical signal that represents an exclusive not OR gate output logic value.

8. The crossbar of claim 7 further comprising microregions, each microregion comprising a chemically different interlayer so that nonlinear, resistive properties of nanowire junctions can be varied from microregion to microregion.

* * * * *